US008207592B2

(12) United States Patent
Quinn

(10) Patent No.: US 8,207,592 B2
(45) Date of Patent: Jun. 26, 2012

(54) INTEGRATED CAPACITOR WITH ARRAY OF CROSSES

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 558 days.

(21) Appl. No.: 12/276,296

(22) Filed: Nov. 21, 2008

(65) Prior Publication Data

US 2010/0127349 A1      May 27, 2010

(51) Int. Cl.
    *H01L 29/92*      (2006.01)
(52) U.S. Cl. ......... 257/532; 257/307; 257/534; 257/535
(58) Field of Classification Search .................. 257/307, 257/532, 534, 535, E23.143, E23.144, E23.151, 257/E23.152, E23.153
    See application file for complete search history.

(56) References Cited

U.S. PATENT DOCUMENTS

| | | | |
|---|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |
| 5,083,184 A | 1/1992 | Eguchi |
| 5,089,878 A | 2/1992 | Lee |

(Continued)

FOREIGN PATENT DOCUMENTS

DE          25 48 563 A1      5/1977

(Continued)

OTHER PUBLICATIONS

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

(Continued)

*Primary Examiner* — Kenneth Parker
*Assistant Examiner* — David Spalla
(74) *Attorney, Agent, or Firm* — Scott Hewett; John J. King

(57) ABSTRACT

A capacitor in an integrated circuit ("IC") has a first plurality of conductive crosses formed in a layer of the IC electrically connected to and forming a portion of a first node of the capacitor and a second plurality of conductive crosses formed in the metal layer of the IC. The conductive crosses in the second plurality of conductive crosses are electrically connected to and form a portion of a second node of the capacitor and capacitively couple to the first node.

9 Claims, 6 Drawing Sheets

U.S. PATENT DOCUMENTS

| | | | |
|---|---|---|---|
| 5,117,114 A | 5/1992 | Street et al. |
| 5,119,169 A | 6/1992 | Kozono et al. |
| 5,142,639 A | 8/1992 | Kohyama et al. |
| 5,155,658 A | 10/1992 | Inam et al. |
| 5,166,858 A | 11/1992 | Frake et al. |
| 5,172,299 A | 12/1992 | Yamada et al. |
| 5,177,410 A | 1/1993 | Hashiguchi et al. |
| 5,189,594 A | 2/1993 | Hoshiba |
| 5,208,725 A | 5/1993 | Akcasu |
| 5,275,974 A | 1/1994 | Ellul et al. |
| 5,583,359 A | 12/1996 | Ng et al. |
| 5,712,813 A | 1/1998 | Zhang |
| 5,868,388 A | 2/1999 | Wood et al. |
| 5,939,766 A | 8/1999 | Stolmeijer et al. |
| 6,037,621 A | 3/2000 | Wilson |
| 6,064,108 A | 5/2000 | Martinez |
| 6,066,537 A | 5/2000 | Poh |
| 6,297,524 B1 | 10/2001 | Vathulya et al. |
| 6,303,456 B1 | 10/2001 | Pricer et al. |
| 6,303,457 B1 | 10/2001 | Christensen et al. |
| 6,383,858 B1 | 5/2002 | Gupta et al. |
| 6,385,033 B1 | 5/2002 | Javanifard et al. |
| 6,410,954 B1 | 6/2002 | Sowlati et al. |
| 6,417,556 B1 | 7/2002 | Long et al. |
| 6,437,431 B1 * | 8/2002 | Mbouombouo et al. ...... 257/676 |
| 6,542,351 B1 | 4/2003 | Kwang |
| 6,570,210 B1 | 5/2003 | Sowlati et al. |
| 6,597,562 B1 | 7/2003 | Hu et al. |
| 6,625,006 B1 | 9/2003 | Aram et al. |
| 6,653,681 B2 | 11/2003 | Appel |
| 6,661,079 B1 | 12/2003 | Bikulcius |
| 6,690,570 B2 | 2/2004 | Hajimiri et al. |
| 6,737,698 B1 | 5/2004 | Paul et al. |
| 6,747,307 B1 | 6/2004 | Vathulya et al. |
| 6,765,778 B1 | 7/2004 | Du et al. |
| 6,819,542 B2 | 11/2004 | Tsai et al. |
| 6,822,312 B2 | 11/2004 | Sowlati et al. |
| 6,880,134 B2 | 4/2005 | Drennan |
| 6,882,015 B2 | 4/2005 | Bernstein et al. |
| 6,897,505 B2 | 5/2005 | Aton |
| 6,903,918 B1 | 6/2005 | Brennan |
| 6,927,125 B2 | 8/2005 | Jones et al. |
| 6,933,551 B1 | 8/2005 | Stribley et al. |
| 6,949,781 B2 | 9/2005 | Chang et al. |
| 6,963,122 B1 | 11/2005 | Soenen et al. |
| 6,974,744 B1 | 12/2005 | Aram et al. |
| 7,009,832 B1 | 3/2006 | Chen et al. |
| 7,013,436 B1 | 3/2006 | Morton et al. |
| 7,027,287 B2 | 4/2006 | Georgakos |
| 7,038,296 B2 | 5/2006 | Laws |
| 7,050,290 B2 | 5/2006 | Tang et al. |
| 7,116,544 B1 | 10/2006 | Sutardja |
| 7,154,734 B2 | 12/2006 | Schultz et al. |
| 7,161,228 B1 | 1/2007 | Pettit |
| 7,170,178 B2 | 1/2007 | Bely et al. |
| 7,193,263 B2 | 3/2007 | Barth |
| 7,195,971 B2 | 3/2007 | Bernstein et al. |
| 7,202,548 B2 | 4/2007 | Lee |
| 7,259,945 B2 | 8/2007 | Cleveland |
| 7,259,956 B2 | 8/2007 | Fong et al. |
| 7,271,465 B2 | 9/2007 | Jessie et al. |
| 7,274,085 B1 | 9/2007 | Hsu et al. |
| 7,298,001 B1 | 11/2007 | Liu |
| 7,348,624 B2 | 3/2008 | Sakaguchi et al. |
| 7,485,914 B2 | 2/2009 | Huang et al. |
| 7,564,675 B2 | 7/2009 | Chen et al. |
| 7,663,233 B2 * | 2/2010 | Lim .............................. 257/734 |
| 7,768,054 B2 | 8/2010 | Benetik |
| 2003/0001272 A1 * | 1/2003 | Brennan et al. ............... 257/760 |
| 2005/0077581 A1 | 4/2005 | Chang et al. |
| 2005/0135042 A1 | 6/2005 | Chiu-Kit Fong et al. |
| 2005/0161725 A1 | 7/2005 | Da Dalt |
| 2006/0203424 A1 * | 9/2006 | Chen et al. .................. 361/306.1 |
| 2007/0126078 A1 * | 6/2007 | Huang et al. ................. 257/532 |
| 2007/0181973 A1 | 8/2007 | Hung et al. |
| 2007/0190760 A1 | 8/2007 | Coolbaugh et al. |
| 2007/0278551 A1 | 12/2007 | Anthony |
| 2007/0296013 A1 | 12/2007 | Chang et al. |
| 2009/0057826 A1 * | 3/2009 | Kim et al. ..................... 257/532 |

FOREIGN PATENT DOCUMENTS

| | | |
|---|---|---|
| DE | 100 46 910 A1 | 10/2001 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| WO | WO 03/090280 | 10/2003 |

OTHER PUBLICATIONS

U.S. Appl. No. 12/276,289, filed Nov. 21, 2008, Quinn, Patrick J., Xilinx, Inc. 2100 Logic Drive, San Jose, California.

U.S. Appl. No. 12/276,291, filed Nov. 21, 2008, Quinn, Patrick J., Xilinx, Inc. 2100 Logic Drive, San Jose, California.

U.S. Appl. No. 12/276,292, filed Nov. 21, 2008, Quinn, Patrick J., Xilinx, Inc. 2100 Logic Drive, San Jose, California.

U.S. Appl. No. 12/276,293, filed Nov. 21, 2008, Quinn, Patrick J., Xilinx, Inc. 2100 Logic Drive, San Jose, California.

U.S. Appl. No. 12/276,280, filed Nov. 21, 2008, Quinn, Patrick J., Xilinx, Inc. 2100 Logic Drive, San Jose, California.

Aparicio and Hajimiri, "Capacity Limits and Matching Properties of Integrated Capacitors", IEEE J. Solid-State circuits, vol. 37, No. 3, pp. 384-93, Mar. 2002.

Samavati, H. et al., "Fractal Capacitor", IEEE Journal of Solid-State Circuit, vol. 33, No. 12 pp. 2035-2041, Dec. 1998.

Chan et al., "Analysis of MMIC Structures Using an Efficient Iterative Approach", IEEE Transactions on Microwave Theory and Techniques, vol. 36, No. 1, Jan. 1988, pp. 96-105.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Rajagopalan et al., "Optimization of Metal-Metal Comb-Capacitors for RF Applications", Wireless Design & Development, Mar. 4, 2001, pp. 1-4.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

Fukuda, H. et al. "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Amintoosi et al., "Using pattern matching for tiling and packing problems" European Journal of Operational Research, Amsterdam, NL, vol. 83, No. 3, Jul. 10, 2007, pp. 950-960.

* cited by examiner

INTEGRATED CAPACITOR WITH ARRAY OF CROSSES

RELATED APPLICATIONS

This patent application is being concurrently filed with commonly owned U.S. Patent Application entitled SHIELDING FOR INTEGRATED CAPACITORS by Patrick J. Quinn; and with commonly owned U.S. Patent Application entitled INTEGRATED CAPACITOR WITH TARTAN CROSS SECTION by Patrick J. Quinn; and with commonly owned U.S. Patent Application entitled INTEGRATED CAPACITOR WITH INTERLINKED LATERAL FINS by Patrick J. Quinn; and with commonly owned U.S. Patent Application entitled INTEGRATED CAPACITOR WITH CABLED PLATES by Patrick J. Quinn; and with commonly owned U.S. Patent Application entitled INTEGRATED CAPACITOR WITH ALTERNATING LAYERED SEGMENTS by Jan L. de Jong et al., the disclosures of which are each hereby incorporated by reference in their entireties for all purposes.

FIELD OF THE INVENTION

The present invention relates to capacitors formed in integrated circuits ("ICs") commonly referred to as "integrated capacitors".

BACKGROUND

Methods of fabricating ICs typically include a front-end sequence of processing, in which various electrical devices such as transistors are formed in a semiconductor substrate, and a back-end sequence of processing, generally including forming alternating layers of dielectric material and patterned conductive material (typically metal) with conductive vias or other techniques being used to interconnect the metal layers to form a three-dimensional wiring structure that connects electrical devices to other electrical devices and to terminals of the IC.

Capacitors are used in IC systems for a variety of purposes. In many instances, it is desirable to incorporate (integrate) a capacitor in the IC chip. A simple approach is to form two conductive plates with an intervening dielectric; however, this consumes a relatively large area for the capacitance obtained. One technique for increasing the capacitance of a given area is to use multiple conductive plates, each conductive plate separated from the proximate plate(s) by dielectric. Further techniques use conducting strips, also called conductive lines, conductive fingers, or conductive traces that are alternately connected to the first and second capacitor terminals (nodes). Sidewall coupling between the conductive strips provides capacitance. Layers of conducting strips, either offset or arranged in vertical congruency, can be added to further increase the capacitance of an integrated capacitor structure.

One capacitor has a number of conductive strips in successive layers connected to the first node alternating with an equal number of conductive strips connected to the second node of the integrated capacitor. The conductive strips are offset a half cell on successive layers, so that a conductive strip connected to the first node has conductive strips connected to the second node above and on both sides of it. Providing an equal number of conductive strips in a layer for each node balances the coupling of each node to the substrate, which is desirable in some applications, but undesirable in others, such as switching applications where it is desirable to have less coupling at one node. In order to reduce coupling to the substrate, a thick layer of silicon dioxide is used between the substrate and the first layer of conductive strips. This may be difficult to integrate in a standard CMOS fabrication sequence, and might require additional steps to be added to the standard process flow. The overlapping parallel conductive strips are connected at their ends using buss strips that consume additional surface area Another approach to providing an integrated capacitor is to have conductive strips in a layer connected to alternate nodes of the capacitor with overlapping conductive strips connected to the same node. This forms essentially a curtain of conductive strips and interconnecting vias connected to the first node of the capacitor with adjacent curtains of conductive strips and interconnecting vias connected to the second node. Overlapping conductive strips connected to the same node avoids the lost surface area associated with buss strips; however, inter-layer capacitance is reduced because the upper strip is connected to the same node as the lower strip. This effect is somewhat obviated because, as critical dimensions shrink, inter-strip capacitance becomes more dominant than inter-layer capacitance. In other words, the dielectric layer separation between successive metal layers becomes increasingly greater than the dielectric separation between conductive strips with decreasing critical dimension.

It is generally desirable that integrated capacitors have high specific capacitance; however, manufacturability and quality factor ("Q factor") is also a concern in many instances. One manufacturability concern is controlling the final capacitance value of an integrated capacitor, both within a large IC, across a wafer, and lot-to-lot.

Thus, integrated capacitors manufacturable to provide a consistent capacitance value are desired. It is further generally desired that integrated capacitors have high capacitance per unit area, low loss (resistance), and low self-inductance, which improves high-frequency applications by increasing self-resonant frequency and the quality of capacitor circuits. In some applications, it is further desirable to shield integrated capacitors from electrical noise.

SUMMARY

A capacitor in an integrated circuit ("IC") has a first plurality of conductive crosses formed in a layer of the IC electrically connected to and forming a portion of a first node of the capacitor and a second plurality of conductive crosses formed in the metal layer of the IC. The conductive crosses in the second plurality of conductive crosses are electrically connected to and form a portion of a second node of the capacitor and capacitively couple to the first node.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Complex ICs, such as programmable logic devices, often have several patterned metal layers separated by layers of dielectric material formed over a semiconductor substrate that are used for wiring connections and other functions. Some embodiments of the invention are adaptable to existing CMOS process sequences by using masks that form the desired patterns in the appropriate metal layers and vias through the inter-metal dielectric ("IMD") layers or inter-layer dielectric ("ILD"). The vias are formed using any of several known techniques, such as contact plug, damascene, or dual damascene techniques. Similarly, the conductive strips are formed using any of several known techniques, such as thin-film metal etch, thin-film metal lift-off, damascene, and dual damascene techniques. In some embodiments, one of the conductive layers is a polysilicon or silicide layer. In a further embodiment, a conductive well in the semiconductor substrate forms a portion of a capacitor plate or a shield.

Integrated capacitors are used in a variety of applications. While high specific capacitance is generally desirable to reduce the surface area of the IC devoted to the integrated capacitor, the resultant capacitance value is also very important in many applications, such as tuning applications. In other words, the capacitance value across an IC chip, across a wafer, and lot-to-lot is important enough to sacrifice specific capacitance in some applications. Integrated capacitors that rely primarily on intra-layer (lateral) capacitance show relatively low variance compared to integrated capacitors that rely heavily on inter-layer (vertical) capacitance because the dimensional accuracy is more controllable within a layer than from layer-to-layer.

The terms "top" node and "bottom" node do not necessarily relate to the physical orientation of the nodes relative to the IC or other structure, but are used as terms of convenience. In some circuit applications, the top node of a capacitor indicates the node that is connected to a high-impedance or high-gain port of an amplifier or other device. In a system-on-chip ("SoC"), the accuracy on an analog-to-digital converter ("ADC") is dependent on the ratio of the parasitic capacitance at the top node ($C_{top}$) to all other nodes except the bottom node and the capacitance ($C_{sig}$) that is the useful floating signal capacitance between both nodes. It is desirable to shield the top plate from ground currents or voltage supply fluctuations so that $C_{top}$ remains low. Note that a capacitor is generally thought of as a two terminal device, and the "top" and "bottom" nodes as described herein generally correspond to these two terminals of the capacitor. Thus, the structures described below may be thought of as connecting (e.g., electrically) to one or the other node, or forming portions of a node. A node is not separate from the capacitive structures connected to it, but those structures may form portions of a node.

Figure 1A:
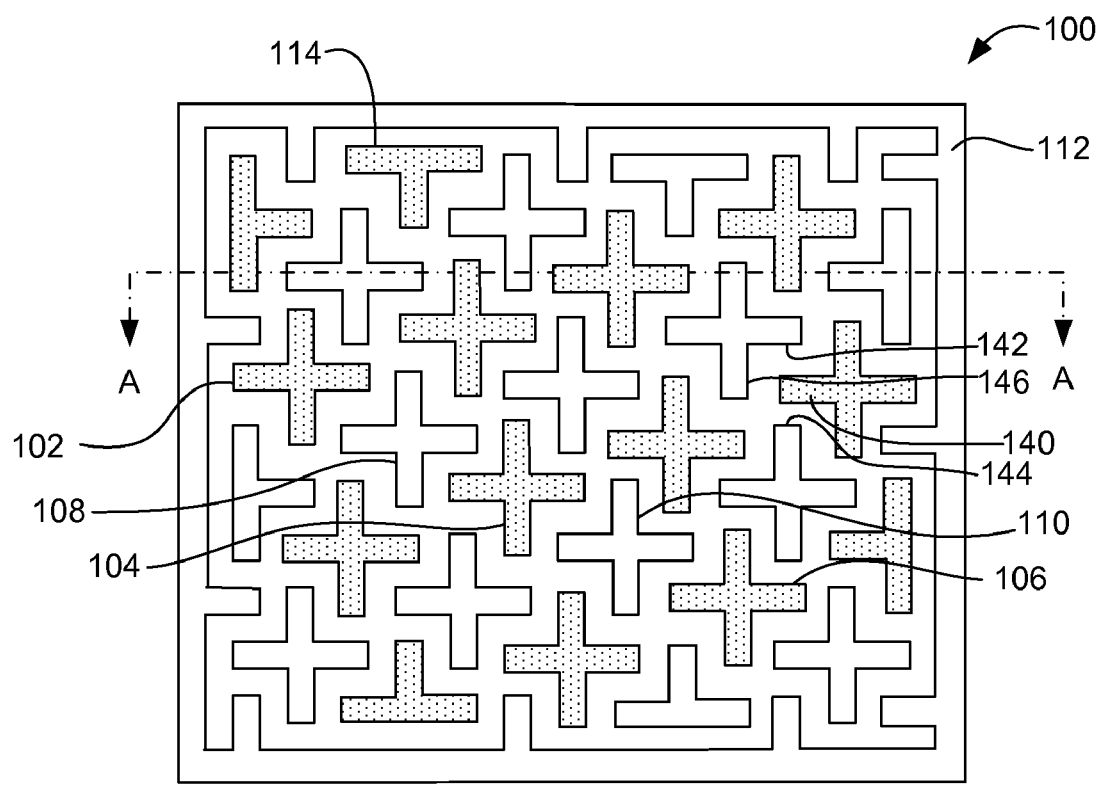
FIG. 1A is plan view of a layer of an integrated capacitor with a repeating pattern of overlapping crosses according to an embodiment.

FIG. 1A is a plan view of a layer of an integrated capacitor 100 with a repeating pattern of overlapping crosses according to an embodiment. Conductive (e.g., metal, polysilicon, or silicide) crosses of one polarity (i.e., connected to a first node of the integrated capacitor and shown with stippling) 102, 104, 106 alternate along a shallow diagonal with crosses of a second polarity 108, 110 (shown without stippling). If a section is taken parallel to an edge, such as along section line A-A, the cross section of the conductive crosses alternate. While the illustrated crosses are symmetrical (i.e., each of the vertical members of the cross are essentially the same length as each of the horizontal members), alternative embodiments incorporate crosses that are not symmetrical, including embodiments where one of the horizontal and/or vertical members is longer than the other.

The layer includes a perimeter shield 112 that surrounds the conductive elements (conductors) 106, 114 (crosses and partial crosses) of the opposite polarity. In a particular embodiment, the perimeter shield and associated crosses and partial crosses are connected to the bottom node of the integrated capacitor and the conductive elements of the opposite polarity are connected to the top node of the integrated capacitor. Interior crosses of each polarity are electrically isolated from each other within the layer by dielectric material, such as silicon dioxide. Electrical connection is made to the interior crosses using vias from a layer above or below the layer illustrated in FIG. 1A (see, e.g., FIGS. 2A-2C), such as vias formed using a dual damascene process, extending from the metal traces in the metal layer illustrated in FIG. 1A to a lower layer, or from an upper layer down to the metal traces in the layer of FIG. 1A. Bringing electrical connections to the interior crosses from metal layers above or below the layer 100 allows the crosses to be defined at or near the minimum (critical) dimension. In other words, the crosses can be made very small and on very small spacings to optimize lateral capacitance between the conductive elements of the top node and the conductive elements of the bottom node, achieving high specific capacitance. In an alternative embodiment, the crosses are not made at the minimum spacing and feature size, allowing for alternative interconnection techniques.

In conventional integrated capacitors using long filament conductors, the maximum length of a metal trace (filament) is restricted by its width. In other words, a filament having the minimum width has an associated maximum length. If a longer filament is desired, the width is increased to maintain process reliability. Increasing width decreases the number of filaments that can be defined across a given layer, which reduces the lateral filament-to-filament capacitance in that layer. Using an array of crosses as shown in FIG. 1A or alternative pattern of crosses (see, e.g., FIG. 4) allows minimum metal line width and minimum spacing between metal features to be maintained across a large area. This provides enhanced lateral capacitance per unit area compared to a conventional filament-type layer in which the filaments have to be widened to maintain design and fabrication rules.

Another issue that can arise with filament-type layers is aliasing during photolithography. Aliasing occurs as a result of interference when closely spaced lines are imaged. Arrays of conductive crosses or other conductive elements do not develop the aliasing associated with long, closely spaced filaments.

In one embodiment, a layer above or below the layer of FIG. 1A overlaps with essentially the same pattern. In an alternative embodiment, a layer having essentially the same pattern partially overlaps the layer of FIG. 1A. In yet another embodiment, a layer having a different pattern (see, e.g., FIG. 3) overlaps the layer of FIG. 1A. Conductive vias electrically connect the conductive elements of a first node conductive matrix in the first layer to the conductive elements of the first node conductive matrix in the other layer, and other conductive vias electrically connect the conductive elements of the second node conductive matrix in the first layer to the conductive elements of the second node conductive matrix in the second layer. A conductive matrix of a node is essentially the conductive elements that are electrically connected to the node that form a three-dimensional conductive matrix in patterned metal layers.

The top and bottom node conductors are formed in dielectric material, such as deposited silicon dioxide or other dielectric materials well known in the art of IC manufacturing. In a particular embodiment, trenches are formed in the dielectric material and then the trenches are filled with metal to form metal traces. To maximize lateral capacitance, the trenches are preferably deep and closely spaced. In a particular embodiment, the metal traces are deeper than they are wide, which promotes lateral capacitance and close-packing for high specific capacitance. In an exemplary embodiment, the metal traces are manufactured to have a minimum metal line width allowed in the manufacturing technology node process for the metal layer in which the traces are formed, and have the minimum metal trace spacing (i.e., dielectric sidewall thickness) allowed. In another embodiment, both the metal trace width and the metal trace spacing are typically about 10% over the minimum allowable values for the metal layer, which may provide more reliable manufacturability. An integrated capacitor that develops a short circuit between the nodes is usually fatal to the operation of the circuit and possibly to the entire IC. Thus, in some embodiments, integrated capacitors are designed to higher manufacturing and reliability standards at the sacrifice of maximum specific capacitance (e.g., manufacturing integrated capacitors at the minimum metal line width for each layer).

Figure 1B:
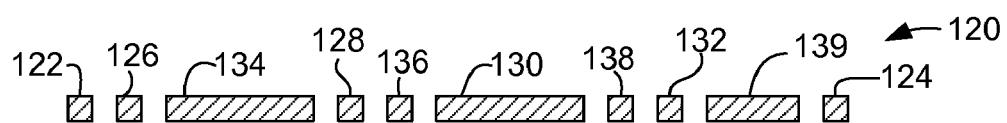
FIG. 1B is a cross section of the layer of FIG. 1A.

FIG. 1B is a cross section 120 of the layer of FIG. 1A taken along section line A-A. Bottom node perimeter shield sections 122, 124 at each end of the layer form a conductive perimeter that isolate interior conductors of the top node 126, 128, 130, 132 from electrical noise or from the top node conductors capacitively coupling with other nodes in the layer. The top node conductors 126, 128, 130, 132 alternate with conductors of the bottom node 134, 136, 138, 139. For purposes of convenient discussion only, the crosses will be described as having two vertical members extending up and down from the center of the cross, and two horizontal members extending right and left. A cross section through both horizontal members and the center (e.g., 134, 130) includes the length of each horizontal member and the width of a vertical member. For purposes of discussion, a cross section along the entire width of a cross will be referred to as a "full cross" section. The arrangement of the array of conductive crosses in the layer of FIG. 1A result in a full cross section 134 of a first polarity (e.g., bottom node) being followed by a first vertical member cross section 128 of a second polarity (e.g., top node), a second vertical member cross section 136 of the first polarity, and a second full cross section 130 of the second polarity.

Referring to the array of crosses in FIG. 1A, it is seen that generally each member (e.g., horizontal member 140) of an interior cross overlaps a portion of a parallel member 142 of an adjacent cross of opposite polarity, overlaps an end 144 of a perpendicular member of a superior or inferior member of another adjacent cross of opposite polarity, and end-couples to a perpendicular member 146 of the first adjacent cross. Thus, the member 140 laterally couples to conductive elements of the opposite node on three sides. FIG. 1A is not drawn to scale, and dimensions are exaggerated for clarity of illustration. In some physical devices according to embodiments of FIG. 1A, the inter-cross spacings are relatively smaller (i.e., the crosses are very close together), and the lateral coupling between crosses is very high from the high fill-factor of the layer. As the separation between crosses shrinks, each interior cross is essentially surrounded by members of other crosses of the opposite polarity. In a layer having minimum or near-minimum line widths and spacings, a high fill factor and high capacitance per unit area is achieved.

Figure 2A:
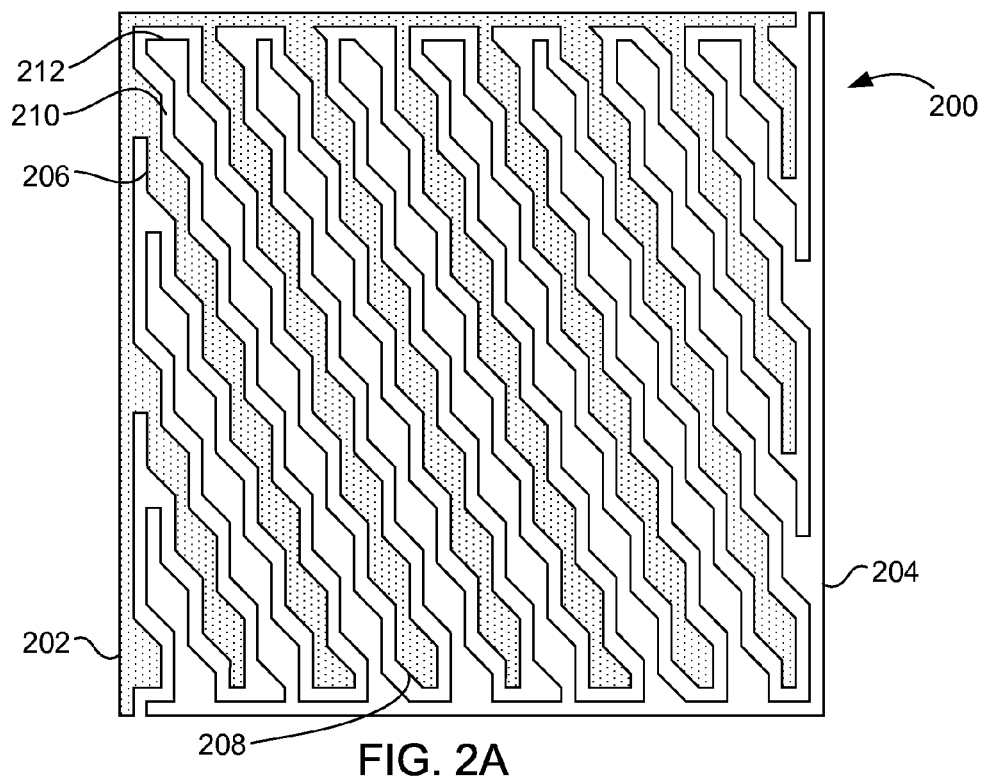
FIG. 2A is a plan view of an interconnection layer according to an embodiment.

FIG. 2A is a plan view of an interconnection layer 200 according to an embodiment. The layer 200 is suitable for use in conjunction with layers above or below the layer 200 generally in accordance with FIG. 1A or other layers according to alternative embodiments that have electrically isolated conductive node elements in the layer. The layer 200 includes a top node interconnector conductor 202 and a bottom node interconnector conductor 204 formed in a metal layer. Conductive vias extending from the top node interconnector conductor 202 to the top node crosses and partial crosses in a metal layer below, or from the top node crosses and partial crosses in a metal layer above, to the top node interconnector conductor 202, electrically interconnects the top node elements of the integrated capacitor to form a top node conductive matrix (see, e.g., FIG. 2B). The top node interconnector conductor 202 includes a number of staggered interconnect traces 206, 208 that trend in a slanted fashion across the layer so as to interconnect conductive crosses (see, e.g., FIG. 1A and FIG. 2C) in an upper or lower metal layer.

Each staggered interconnect trace has wider sections alternating with narrower sections. The wider sections offset the staggered trace in the X direction about one half of a full cross section, and the narrower sections drop the staggered trace in the Y direction. In a particular embodiment, the width of the wider sections is increased to bring adjacent traces close together, which shortens the narrower sections until the staggered trace becomes essentially a series of truncated diamond shapes. The staggered interconnect traces 206, 212 capacitively couple across a gap 210 that is typically filled with dielectric material, as described above for the layer 100 in FIG. 1A, providing intralayer capacitance and adding to the specific capacitance of the integrated capacitor.

The wider sections enhance interlayer capacitance, as explained below in reference to FIG. 2B, and also enhance intralayer capacitance in the interconnector layer 200 by bringing the staggered traces of one node close to the staggered traces of the opposite node. In a particular embodiment, the staggered traces are defined to at least partially overlay and electrically connect to a series of conductive crosses having the same polarity, and to also at least partially overlay and capacitively couple to a series of conductive crosses having the opposite polarity.

In a particular embodiment, this separation between traces is at or near the minimum spacing specification for the metal layer in which the interconnector layer is patterned, promoting intralayer capacitance in the interconnector layer. Alternatively, an interconnection layer has straight-sided traces that slant along the angle of crosses of a polarity with electrical connections being made to the conductive crosses below, however, staggered traces increase the perimeter length of the trace compared to a straight-sided trace, providing increased lateral capacitance between traces in the interconnection layer.

Figure 2B:
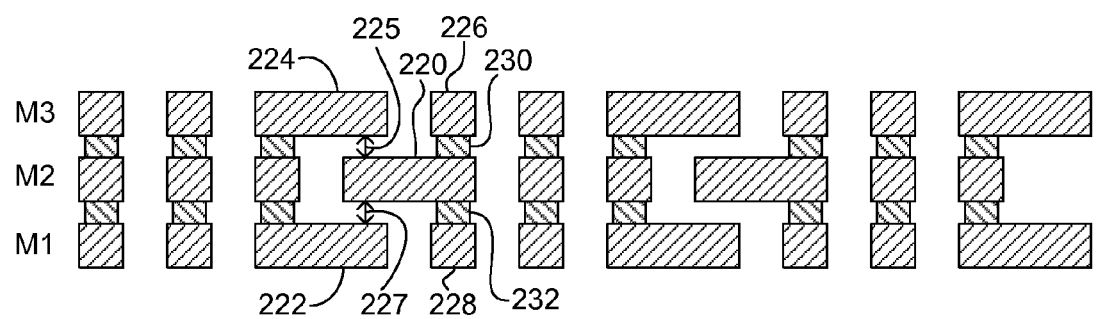
FIG. 2B is a cross section of the layer of FIG. 2A between layers in accordance with FIG. 1A

FIG. 2B is a cross section of the layer of FIG. 2A between layers in accordance with FIG. 1A. A first layer of alternating crosses generally in accordance with the techniques of FIG. 1A is fabricated in a first metal layer M1, an interconnector layer in accordance with FIG. 2A is fabricated in a second metal layer M2, and a second layer of alternating crosses in accordance with FIG. 1A is fabricated in a third metal layer M3. In layers M1 and M3, the sections of conductive elements alternate between nodes (see, FIG. 1B). In the interconnector layer M2, metal interconnect trace 220, which is electrically connected to a first node of the integrated capacitor, overlaps metal elements 222 and 224, which are in layers M1 and M3 and which are connected to the second node of the integrated capacitor, providing interlayer capacitance 225, 227. The metal element 220 is a portion of a staggered trace that has a width greater than the width of vertical members 226, 228 of the same polarity to which it electrically connects through vias 230, 232.

Figure 2C:
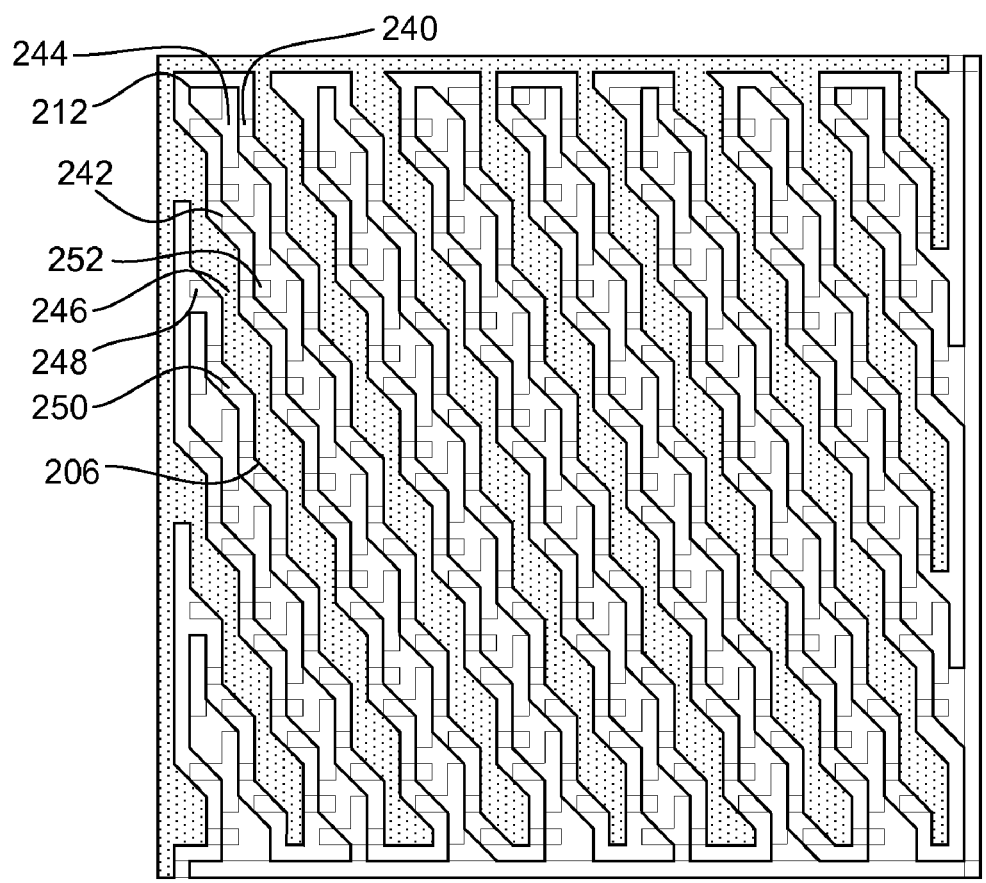
FIG. 2C is a plan view of the layer of FIG. 2A superimposed over a layer in accordance with FIG. 1A.

FIG. 2C is a plan view of the layer of FIG. 2A superimposed over a layer in accordance with FIG. 1A. The staggered trace 212 connects to conductive crosses 240, 242 through vias 244, 246 to form a bottom node conductive matrix, and the staggered trace 206 similarly connects conductive crosses 248, 250 to form a top node conductive matrix. In a further embodiment, a second layer of otherwise isolated crosses is superimposed on the interconnect layer to produce top and bottom node conductive matrices essentially in accordance with FIG. 2B. The staggered traces are sufficiently wide to produce inter-layer capacitance with conductive elements of the opposite node. For example, a wide portion of staggered trace 246 overlaps a portion 252 of cross 248.

Figure 3A:
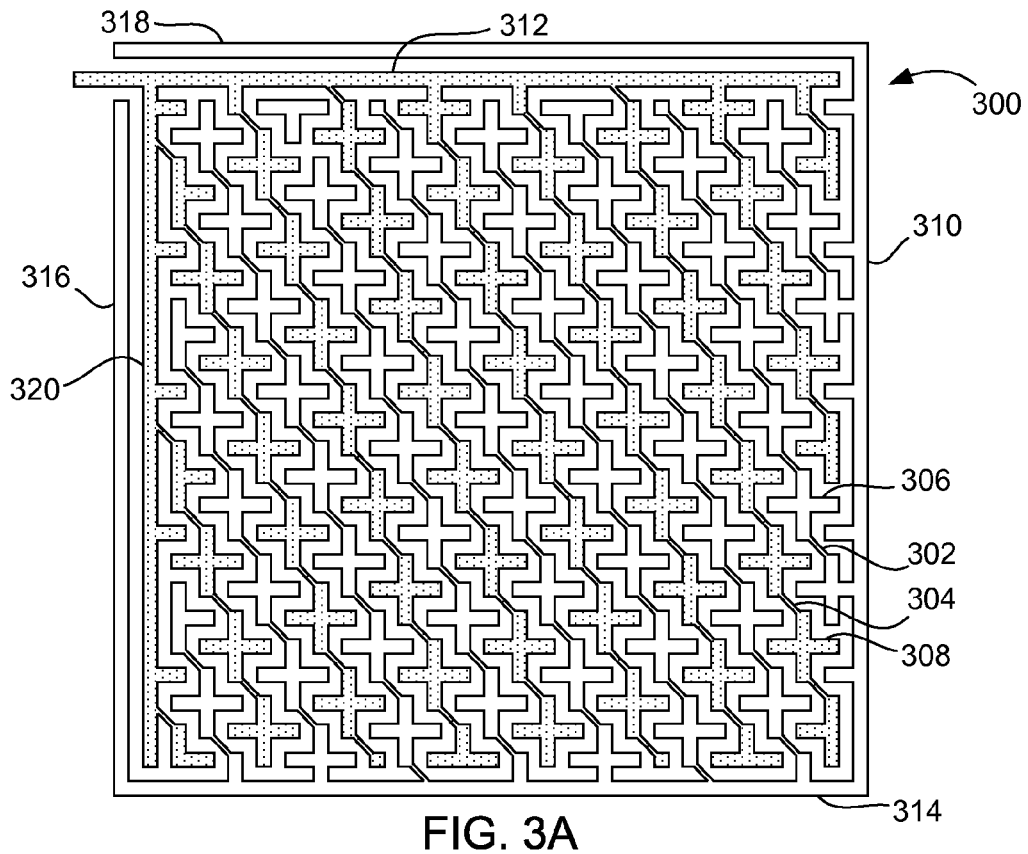
FIG. 3A is a plan view of a layer of an integrated capacitor with an array of crosses having intra-layer interconnects according to another embodiment.

FIG. 3A is a plan view of a layer 300 of an integrated capacitor with an array of crosses having intra-layer interconnects 302, 304 according to another embodiment. The patterned layer 300 has an array of conductive crosses, some of which are interconnected to the bottom node, while the others are interconnected to the top node within the layer. The patterned layer 300 is useful in several embodiments of integrated capacitors. In some embodiments, the patterned layer 300 is used above or below a layer in accordance with FIG. 1A, wherein conductive vias electrically connect the isolated crosses in one layer to the interconnected crosses of patterned layer 300. In such embodiments, the isolated crosses are larger than minimum dimension, although in some embodiments they are larger than the interconnected crosses to bring the sidewalls of the conductive isolated crosses closer together. Using conductive crosses allows a designer to use the minimum line width for that metal layer, as the vertical and horizontal legs of the crosses are relatively short. Typically, the minimum line width allowed for a feature in a metal layer depends in part on the length of the line. Long conductive traces have a wider minimum width to avoid a break in the trace. In other embodiments, multiple layers in accordance with FIG. 3A are stacked with alternating layers having the opposite polarity, in other words, a conductive cross in the Nth metal layer has the opposite polarity from an overlying or underlying cross in the N+1 or N−1 metal layer (see FIG. 3B).

Diagonal interconnects 302, 304 interconnect crosses 306, 308 and partial crosses to buss bars 310, 312. The integrated capacitor layer includes optional shield bars 314, 316. The shield bars 314, 316 and bottom node buss bars 310, 318 essentially surround the conductive elements of the top node in the layer 300, including the top node buss bars 312, 320, limiting capacitive coupling. The first top node buss bar 320 extends along a first edge of the layer 300 and the second top node buss bar 312 extends from the first top node buss bar 320 along a first perpendicular edge of the layer. Similarly, the first bottom node buss bar 310 extends along a second edge of the layer and the second bottom node buss bar 318 extends from the first bottom node buss bar 310 along a second perpendicular edge of the layer.

Figure 3B:
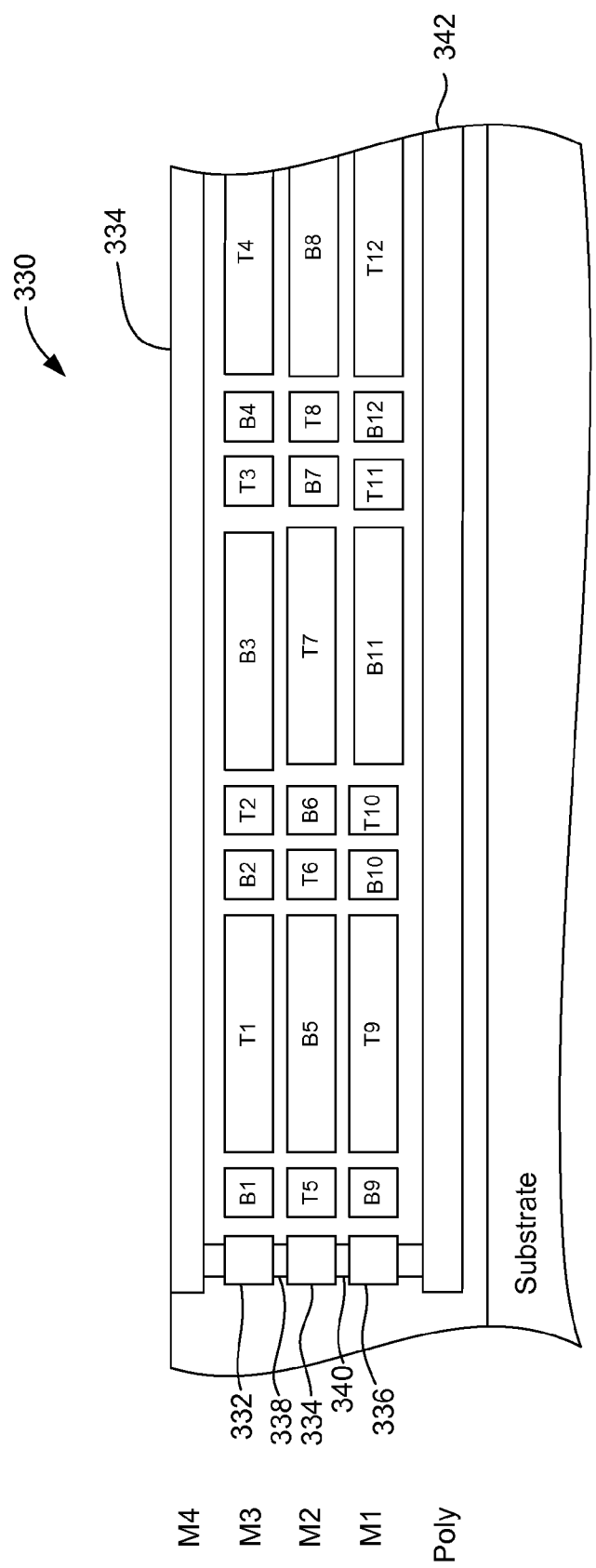
FIG. 3B is a side view of an integrated capacitor incorporating layers in accordance with FIG. 3A

FIG. 3B is a side view of an integrated capacitor 330 incorporating layers in accordance with FIG. 3A formed in metal layers M1, M2, M3. The outer elements 332, 334, 336 are connected to the bottom node of the integrated capacitor within the metal layers M3, M2, M1 of the integrated capacitor and are optionally connected layer-to-layer with conductive vias 338, 340. The outer elements are a bottom node buss bar or shield bar, for example. Conductive elements T1, T2, T3, T4 are connected to the top node and alternate with conductive elements B1, B2, B3, B4, which are connected to the bottom node. The conductive elements in the M2 layer T5, T6, T7, T8 alternate with conductive elements B5, B6, B7, B8 and are of the opposite polarity from the corresponding elements in the M3 layer, providing interlayer capacitance. Similarly, conductive elements B9, B10, B11, B12 alternate with conductive elements T9, T10, T11, T12 in M1 and are of the opposite polarity from the overlying conductive elements. Intralayer connections (see FIG. 3A, ref. nums. 302, 304) connect interior conductive elements of each node within the layers M1, M2, M3, avoiding the need for conductive vias between metal layers to connect conductive elements of the node matrices together (compare, FIG. 2B). The integrated capacitor optionally includes a first bottom node shield plate 342 formed in a polysilicon or silicide ("poly") layer, and a second bottom node shield plate 344 formed in the M4 layer. The first and second bottom node shield plates, in conjunction with the outer bottom node elements 332, 334, 336 and vias 338, 340 form essentially a Faraday cage around the top node conductive matrix, shielding the top node from coupling to other nodes (i.e., other than the bottom node) in the IC. Additionally shielding, such as a ground shield plate in an M5 layer (not shown), ground shield matrix, or power supply (e.g., $V_{DD}$) shield matrix is optionally included to shield or essentially surround the integrated capacitor.

Figure 4:
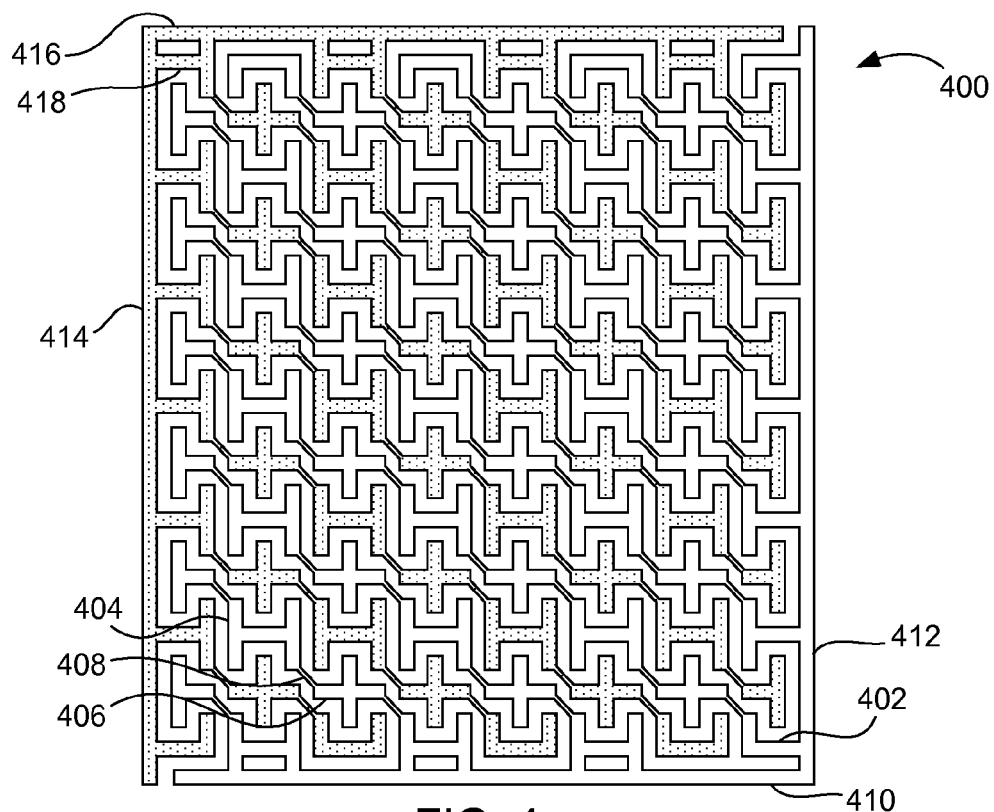
FIG. 4 is a plan view of a layer of an integrated capacitor with an array of crosses and H-elements having intra-layer interconnects according to another embodiment.

FIG. 4 is a plan view of a layer 400 of an integrated capacitor with an array of crosses and H-elements having intra-layer interconnects according to another embodiment. A bottom node conductor 402 includes H-elements 404 (i.e., elements shaped like an "H") interconnected to cross elements 406 (i.e., elements shaped like a "+") along a diagonal using interconnects 408. The patterned layer 400 has rows of H-elements alternating with rows of cross elements. In the rows of H-elements, H-elements connected to the bottom node alternate with H-elements connected to the top node. Similarly, in the rows of cross elements, cross elements connected to the top node alternate with cross elements connected to the bottom node. Vertical conductive members of the cross elements overlap with vertical conductive members of the H-elements to provide lateral coupling between cross elements and H-elements of opposite polarity. The array of conductive elements provides good fill density (intra-layer capacitance) and the repetitive nature of the elements avoids long runs of metal traces that might be restricted to minimum widths or cause aliasing during photolithography, as discussed above in reference to FIG. 1A.

Bottom node buss bars 410, 412 extending along perpendicular edges are provide electrical connection to the interior cross elements, H-elements, and partial elements of the bottom node conductor. Top node buss bars 414, 416 extending along opposite perpendicular edges similarly provide electrical connection to the interior cross elements, H-elements, and partial elements of the top node conductor 418. In a particular embodiment, layers according to FIG. 4 are stacked with each layer having the polarity of the conductive elements reversed. The interconnects running diagonally from the buss bar to a cross element and then to alternating H-elements and cross elements electrically connect the conductive elements in the layer to the desired node. If another layer in accordance with FIG. 4 is formed and the polarities of the buss bars reversed, the conductive elements in opposing layers provide interlayer (vertical) capacitance.

Note that the types of and number of layers described are merely examples, and in some embodiments other suitable layers may be used, and any number of layers may be used. For example, the layers used may depend on the types and numbers of layers that are available in the manufacturing process, and other arrangements will be apparent to those of skill in the art. In general, any suitable layer, and an arbitrary number of layers may be used in accordance with embodiments of the present invention.

Figure 5:
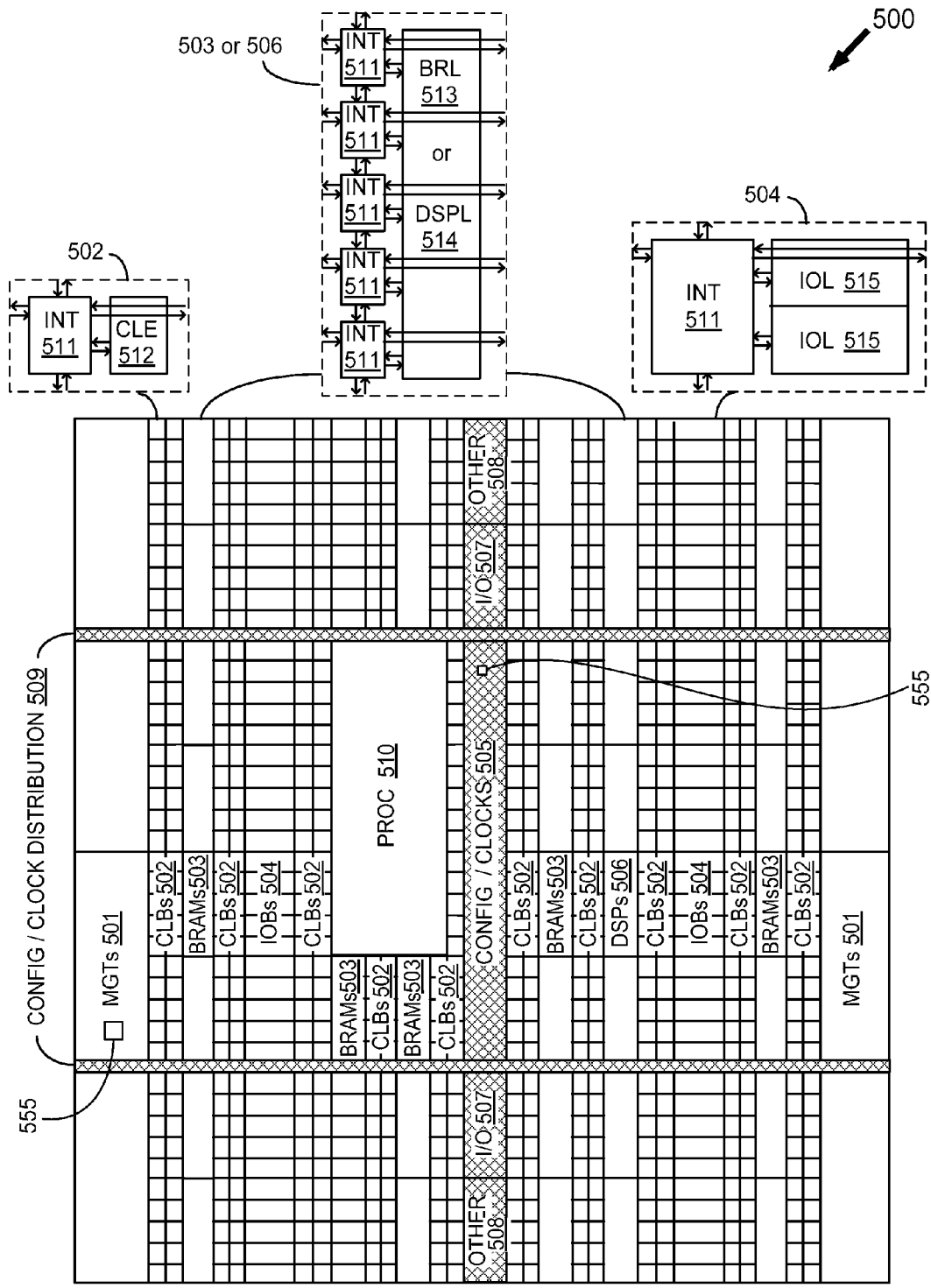
FIG. 5 is a plan view of an FPGA incorporating an integrated capacitor according to an embodiment.

FIG. 5 is a plan view of an FPGA 500 semiconductor device incorporating an integrated capacitor according to an embodiment. The FPGA 500 includes CMOS portions in several of the functional blocks, such as in RAM and logic, and is fabricated using a CMOS fabrication process. One or more integrated capacitors 555 according to one or more embodiments of the invention are incorporated in any of several functional blocks of the FPGA, such as a clock circuit 505, a multi-gigabit transceivers 501, or other functional block; within many functional blocks; or within a physical section or segment of the FPGA 500. Integrated capacitors 555 are particularly desirable in applications where one or both terminals of the capacitor are switched, and embodiments including top node shielding are further desirable in applications wherein the top node is connected to or switched to a high-impedance or high-gain node of a circuit in the FPGA 500. Capacitors are generally useful in a wide variety of integrated circuits and in a wide variety of applications. For instance, one or more capacitors may be useful for a switched capacitor network, such as in an analog-to-digital converter, or as a decoupling or filtering capacitor for AC signaling (e.g., in an MGT). In general, the capacitor structure described herein may be useful in any application requiring capacitance.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A capacitor in an integrated circuit ("IC") comprising:
 a first plurality of conductive crosses formed in a first conductive layer of the IC, each of the first plurality of conductive crosses being electrically connected to and forming a first portion of a first node of the capacitor;
 a second plurality of conductive crosses formed in the first conductive layer of the IC, each of the second plurality of conductive crosses being electrically connected to and forming a first portion of a second node of the capacitor and capacitively coupling to the first node;
 an interconnection layer formed in a second conductive layer of the IC separated from the first conductive layer by a dielectric layer of the IC, the interconnection layer having a first plurality of staggered interconnect traces connected to the first plurality of conductive crosses alternating with a second plurality of staggered interconnect traces connected to the second plurality of conductive crosses, each staggered interconnect trace having wider sections alternating with narrower sections; and
 a third conductive layer of the IC, the interconnection layer being between the third conductive layer and the first conductive layer, the third conductive layer having a third plurality of conductive crosses electrically connected to the first node through the first plurality of staggered interconnect traces and a fourth plurality of conductive crosses electrically connected to the second node through the second plurality of staggered interconnect traces.

2. The capacitor of claim 1 wherein each of the first plurality of conductive crosses is symmetrical.

3. The capacitor of claim 2 wherein each of the second plurality of conductive crosses is symmetrical.

4. The capacitor of claim 1 wherein the conductive crosses in the first plurality of conductive crosses are electrically isolated from each other within the first conductive layer by dielectric material.

5. The capacitor of claim 1 further comprising a first buss bar electrically connected to and forming a second portion of the first node and a second buss bar electrically connected to and forming a second portion of the second node, wherein each of the first plurality of conductive crosses is electrically connected to the first buss bar in the interconnection layer and each of the second plurality of conductive crosses is electrically connected to the second buss bar in the interconnection layer.

6. The capacitor of claim 1 wherein a first horizontal member of a first cross of the first plurality of conductive crosses overlaps a portion of a staggered interconnect trace of the first plurality of staggered interconnect traces, and further comprising a conductive via disposed at an end of the first horizontal member extending to the staggered interconnect trace.

7. The capacitor of claim 1 wherein the first conductive layer is a first metal layer of the IC, the interconnection layer is a second metal layer of the IC, and the third conductive layer is a third metal layer of the IC.

8. The capacitor of claim 1 wherein a staggered interconnect trace at least partially underlies and is connected to a first cross of the first plurality of conductive crosses and at least partially underlies and capacitively couples to a second cross of the second plurality of conductive crosses.

9. The capacitor of claim 8 wherein the first cross in the layer has a vertical element having a first width and each of the first plurality of staggered interconnector traces has a first portion having the first width and a second portion having a second width greater than the first width.

* * * * *